(12) United States Patent
Chen

(10) Patent No.: US 7,038,916 B2
(45) Date of Patent: May 2, 2006

(54) EXPRESS CARD HOUSING STRUCTURE

(76) Inventor: George Chen, P.O. Box No. 6-57, Junghe, Taipei 235 (TW)

(*) Notice: Subject to any disclaimer, the term of this patent is extended or adjusted under 35 U.S.C. 154(b) by 146 days.

(21) Appl. No.: 10/777,118

(22) Filed: Feb. 13, 2004

(65) Prior Publication Data

US 2005/0180119 A1    Aug. 18, 2005

(51) Int. Cl.
*H05K 1/14* (2006.01)

(52) U.S. Cl. .................. 361/737; 361/756; 361/946; 361/684; 361/725

(58) Field of Classification Search ............... 361/737, 361/818, 800, 816, 740, 756, 725, 684; 439/76.1, 439/946; 174/52.1
See application file for complete search history.

(56) References Cited

U.S. PATENT DOCUMENTS 5,490,043 A * 2/1996 Tan et al. .................. 361/818
6,058,018 A * 5/2000 Gerrits et al. ............... 361/737
6,577,506 B1 * 6/2003 Wakita et al. ............... 361/737

\* cited by examiner

*Primary Examiner*—Randy W. Gibson
*Assistant Examiner*—Hung S. Bui

(57) ABSTRACT

The invention discloses an express card housing structure serving as a housing for accommodating light in weight, small in size and portable hardware devices, which are used as memories or execute various media. The express card housing includes a connector housing, terminals, a main frame, and upper and lower housings. The invention is characterized that, fastening openings at the lower housing are fastened with fastening sections at two inner sides of the main frame, and inverted U-shaped clasp sections bent downward at two lateral sides of the upper housing are positioned in clasp channels at two sides of the main frame for facilitating assembly of the invention. The terminals are devised as structures having a connect pin and can be installed with one-step installation process for elevating production efficiency and yield rate.

4 Claims, 6 Drawing Sheets

EXPRESS CARD HOUSING STRUCTURE

BACKGROUND OF THE INVENTION (a) Field of the Invention

The invention relates to an express card housing structure, and more particularly, to a housing for accommodating light in weight, small in size and portable hardware devices that serve as memories or execute various media for notebook expansions, and comprises a connector housing, terminals, a main frame, a lower housing and an upper housing.

(b) Description of the Prior Art

Due to rapid advancement of computer industries on top of market demands, newly defined express specifications are gradually replacing prior PCMCIA specifications. Based on requirements of upstream manufacturers, up-to-date housings for portable devices are needed.

SUMMARY OF THE INVENTION

Therefore, the primary object of the invention is to provide an express card housing structure having a simple replacement procedure and a reinforced conformation, so as to prevent disengagement of upper and lower housings thereof from a main frame thereof.

The secondary object of the invention is to provide an express card housing structure having a connecting pin and being capable of installing terminals in a one-step procedure for reducing time required for installing terminals.

To accomplish the aforesaid objects, an express card housing structure comprises a connector housing, terminals, a main frame, a lower housing and an upper housing. The lower housing has symmetrical fastening openings at two sides thereof for fastening with fastening sections at inner sides of the main body. The upper housing has symmetrical inverted U-shaped clasp sections bent downward at two lateral sides thereof for positioning corresponding clasp channels at outer sides of the main frame. The terminals are devised as new-type express specifications as having a connect pin section for a one-step installation process, and are inserted via a terminal groove at a rear end of the connector housing, so as to adhere terminal pins at lower sections of the terminal bodies to a printed circuit board (PCB).

According to the aforesaid structure, by corresponding and inserting the locating sections disposed at the front end of the connector housing into the locating notches of the main frame, the fastening sections at two inner sides of the main frame and fastening openings at two lateral sides of the lower housing, and the inverted U-shaped clasp sections bent downward at two lateral sides of the upper housing and clasp channels at the two sides of the main frame, the express card is provided with a simple installation process while preventing disengagement of the upper and lower housings from the main frame. In conjunction with new-type express specifications, the terminals are made into a structure having a connect pin and can be installed using one-step installation process by inserting the terminals from a rear end of the connector housing. The terminal bodies at the front end of the terminals are snapped off from the connecting portion at the rear end, and the terminal pins at the lower portion of the terminal bodies are adhered to a PCB, thereby reducing time required for installing the terminals.

DETAILED DESCRIPTION OF THE PREFERRED EMBODIMENTS

To better understand the structures, devices and characteristics of the invention, detailed descriptions of a preferred embodiment shall be given with the accompanying drawings below.

Figure 1:
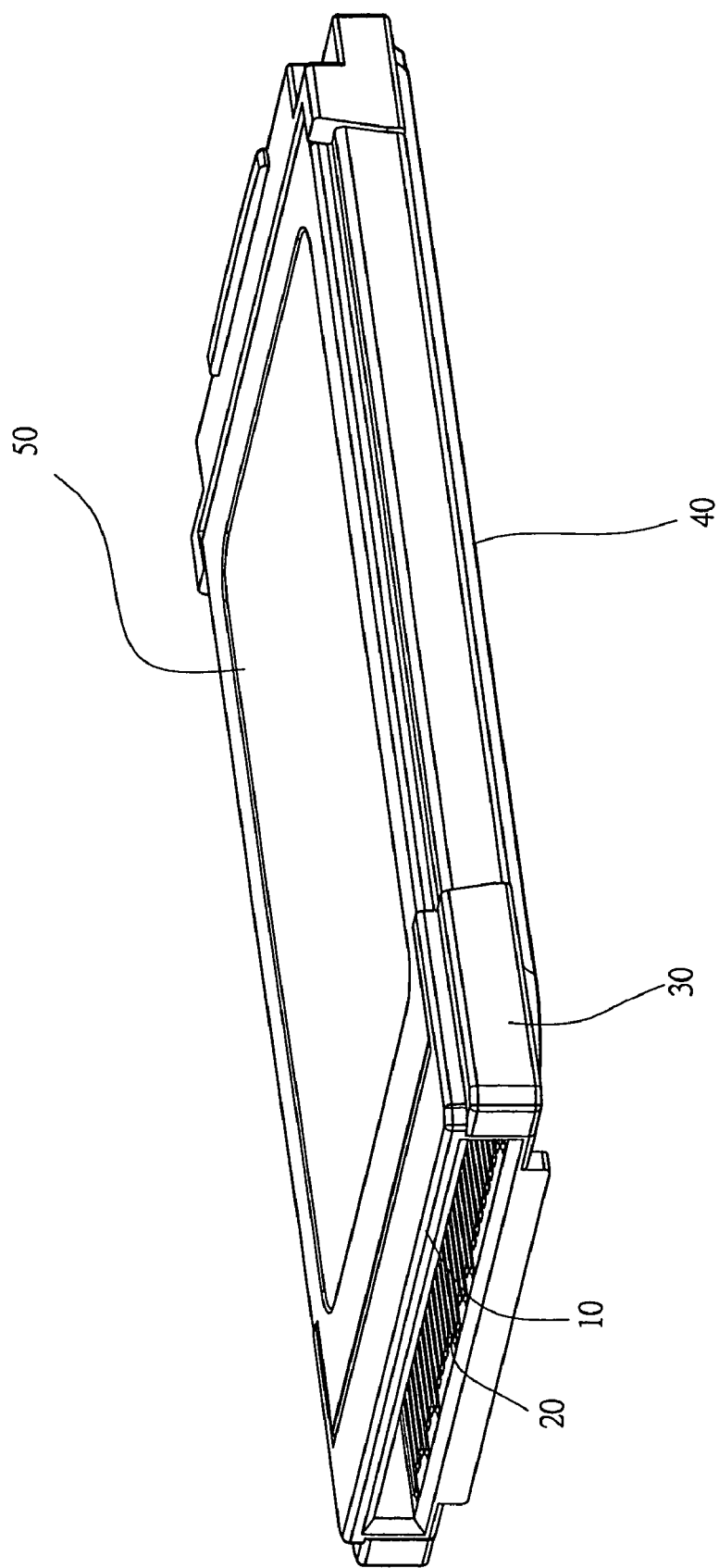
FIG. 1 shows an exploded elevational view according to the invention.
Figure 2:
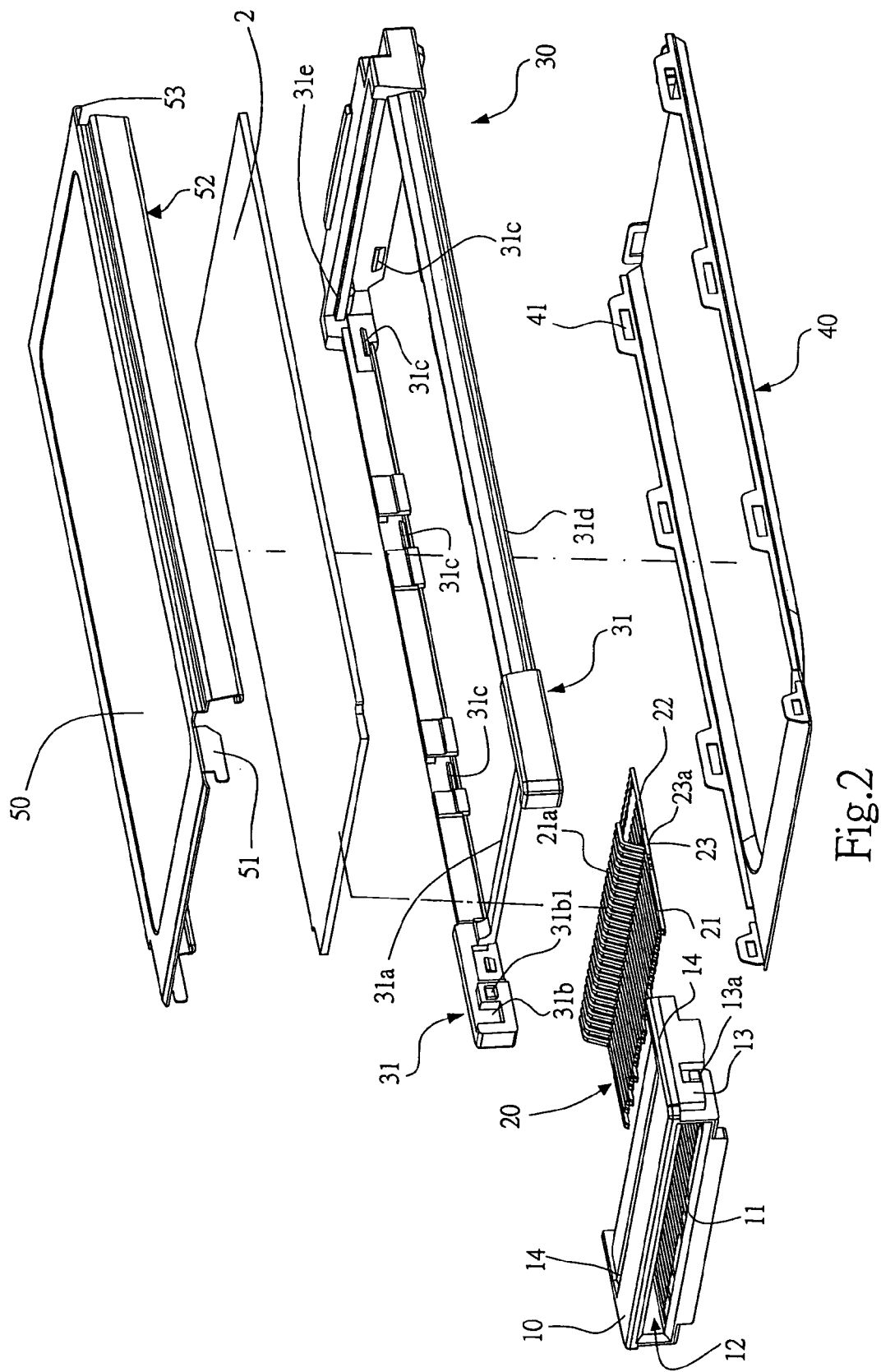
FIG. 2 shows an elevational view according to the invention in assembly.

Referring to FIGS. 1 and 2, an express card housing structure according to the invention comprises a connector housing 10, terminals 20, a main frame 30, a lower housing 40 and an upper housing 50.

The connector housing 10 is an integral and rectangular housing formed by plastic extrusion; and has a perforated terminal groove 11 at a center portion thereof, an opening 12 at a front end thereof for connecting to a computer plug, locating sections 13 at left and right sides thereof, with each locating section 13 having a square locating member 13a at a rear portion thereof for corresponding with a locating indentation 31b1 at the main frame 30, and clasp channels 14 at front and rear sides thereof.

The terminals 20 are formed by bent metals. Each terminal 20 is consisted of a front terminal body 21 and a rear connecting portion 22, with a rear end of the terminal body 21 downwardly bent to form a terminal pin 21a. At a joint of the terminal body 21 and the connecting portion 22 is a connect pin section 23, which is formed by excavating two inverted V-shape clefts 23a at an upper metal surface of the connecting portion 22 and is reserved with a small portion of metal for joining with the connecting portion 22 at the rear end.

The main frame 30 is an integral formed by metal molding or plastic extrusion, and appears as a U-shape when viewed from above. The main frame 30 has a post 31a at a front end of an opening thereof for joining left and right frames 31. Each of the left and right frames 31 is disposed with a locating notch 31b at a front end thereof wherein each locating notch 31b has a square locating indentation 31b1, a plurality of symmetrical fastening sections 31c at an inner edge thereof, symmetrical clasp channels 31d at outer side walls of the left and right frames 31 and extending from a front end through to a rear end, and a long groove 31e at an upper rear end thereof.

The lower housing 40 is a plate-like body formed by shearing and stamping a metal plate, and has a plurality of symmetrical fastening openings 41 facing upward at two lateral sides and a rear side thereof for corresponding with the fastening sections 31c of the main frame 30.

The upper housing 50 is a plate-like body formed by shearing and stamping a metal plate; and has clasp sections 51 at a front end thereof for clasping with the clasp channels at two sides of the connector housing, a plurality of inverted U-shaped clasp sections 52 bent downward at two lateral sides thereof, and a downwardly and backwardly bent folded panel 53 at a rear end thereof for correspondingly inserting into the long groove 34e of the main frame 30.

For assembly, the terminals 20 are inserted into the terminal groove 11 at the rear end of the connector housing 10. The terminal bodies 21 at the front end of the terminals 20 are snapped off from the rear connecting portion 22, and the terminal pin sections 21a at the lower portion of the terminal bodies 21 are adhered to a printed circuit board (PCB) 2. The fastening sections 31c at two inner sides of the main frame 30 are fastened with the fastening openings 41 at two lateral sides of the lower housing 40. The connector housing 10 and the PCB 2 are placed into the main frame 30. The locating sections 13 at the front end of the connector housing 10 are corresponded with and inserted into the locating notches 31b of the main frame 30, and the square locating members 13a are positioned in the square locating indentations 31b1. The folded panel 53 at the rear portion of the upper housing 50 is inserted into the long groove 31 of the main frame 30, and the inverted U-shaped clasp sections 52 at the two sides of the upper housing 50 are clasped with the clasp channels 31d at the two sides of the main frame 30, thereby completing an assembly of the invention.

Figure 3:
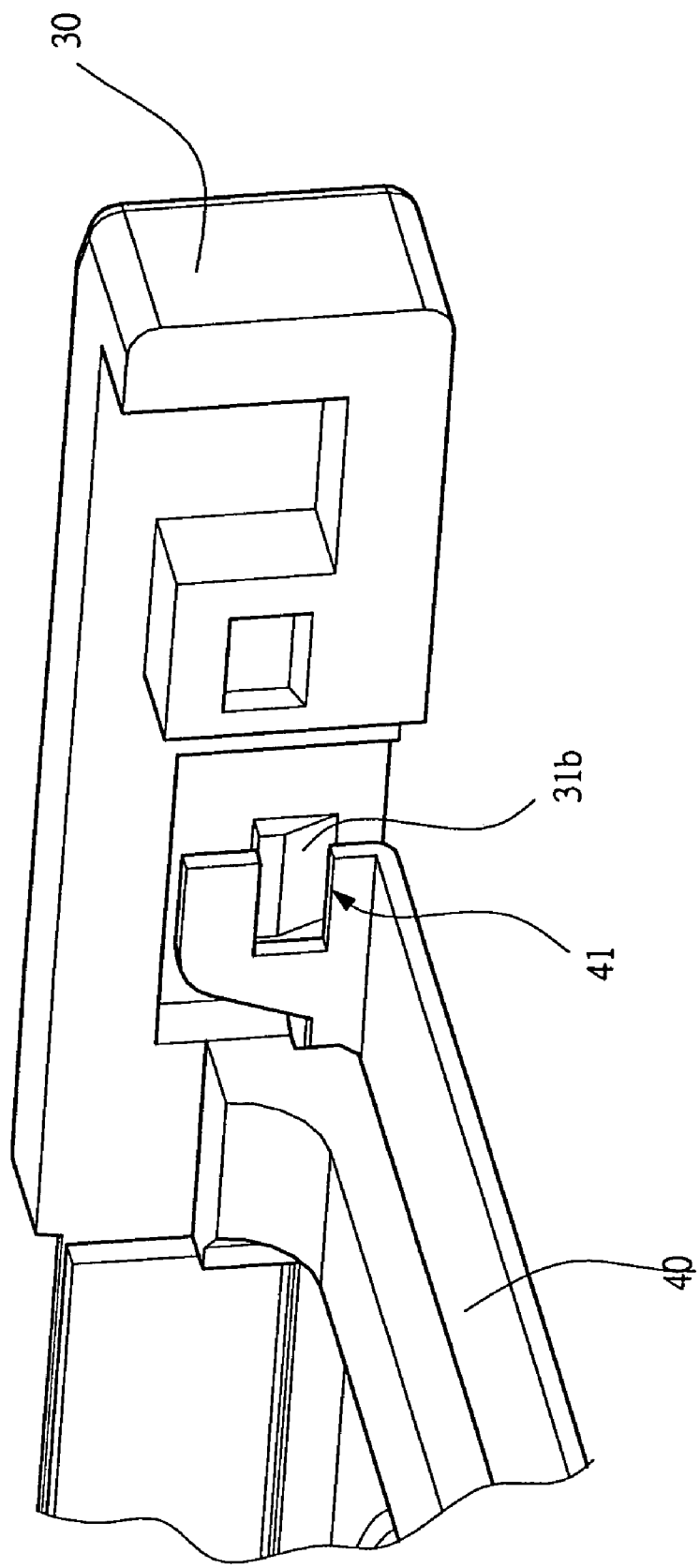
FIG. 3 shows a schematic view illustrating the lower housing joined with the main frame according to the invention.

Referring to FIG. 3 showing a schematic view illustrating the lower housing 40 joined with the main frame 30, the fastening sections 31c at two inner sides of the main frame 30 are fastened with the fastening openings 41 at two sides of the lower housing 40.

Figure 4:
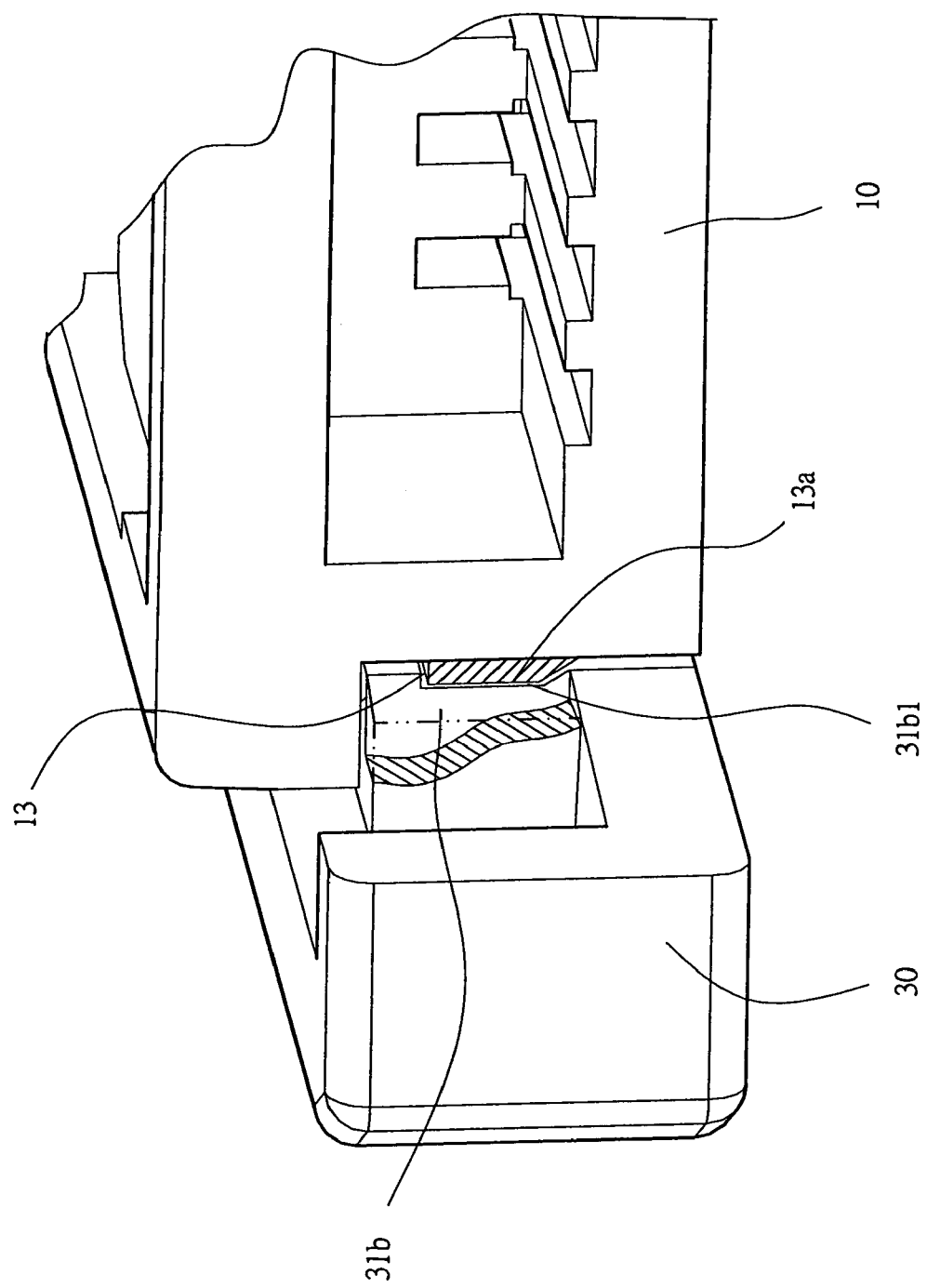
FIG. 4 shows a schematic view illustrating the connector housing joined with the main frame according to the invention.

Referring to FIG. 4 showing a schematic view illustrating the connector housing installed with the main frame according to the invention, the locating sections 13 at the front portion of the connector housing 10 are correspondingly inserted into the locating notches 31b of the main frame 30, and the square locating members 13a are positioned in the square locating indentations 31b1.

Figure 5:
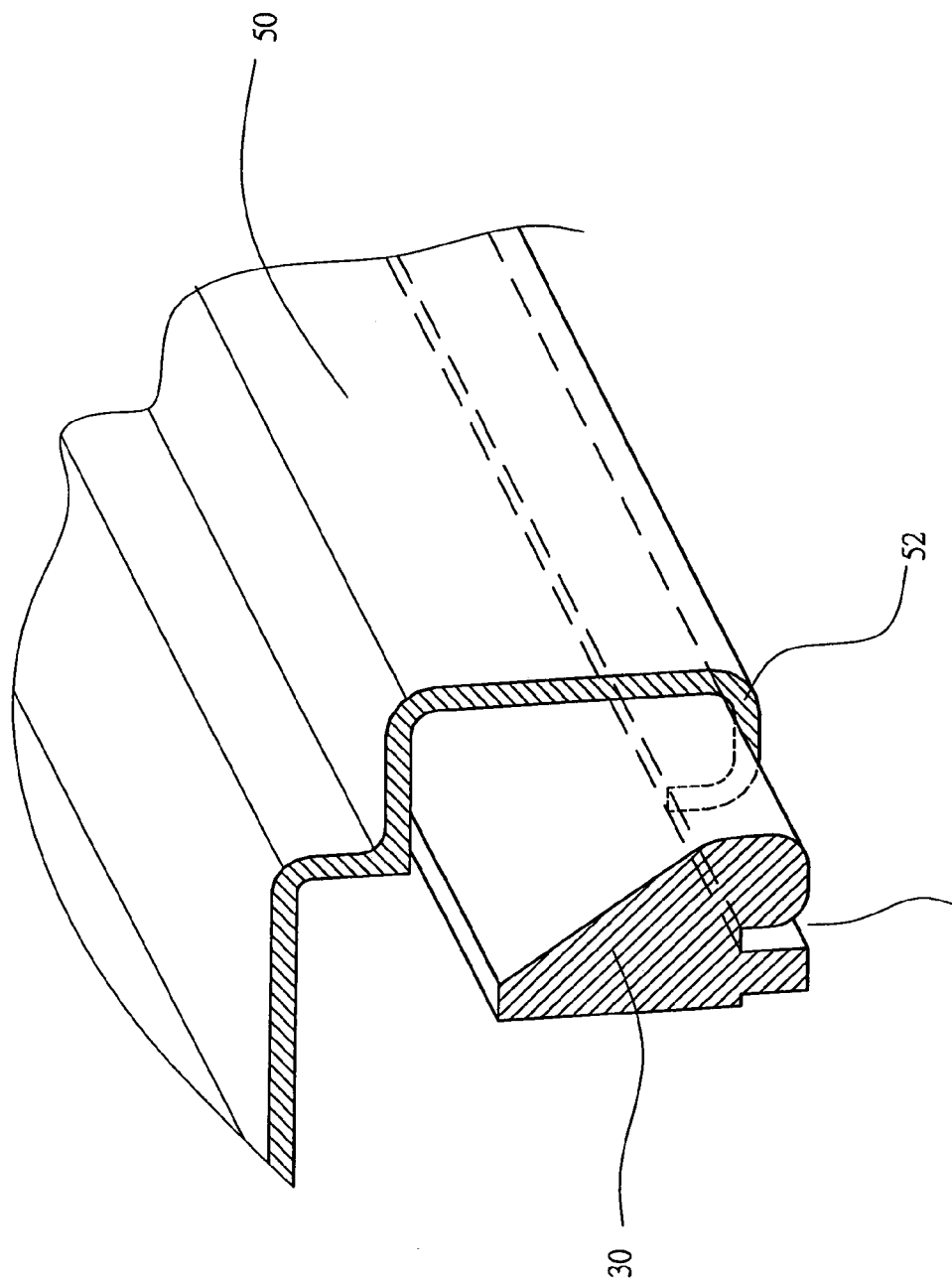
FIG. 5 shows a schematic view illustrating the upper frame fastened with the main frame according to the invention.

Referring to FIG. 5 showing the upper housing assembled with the main frame according to the invention, the inverted U-shaped clasp sections 52 at the two sides of the upper housing 50 are clasped at the clasp channels 31d at the two sides of the main frame 30.

Figure 6:
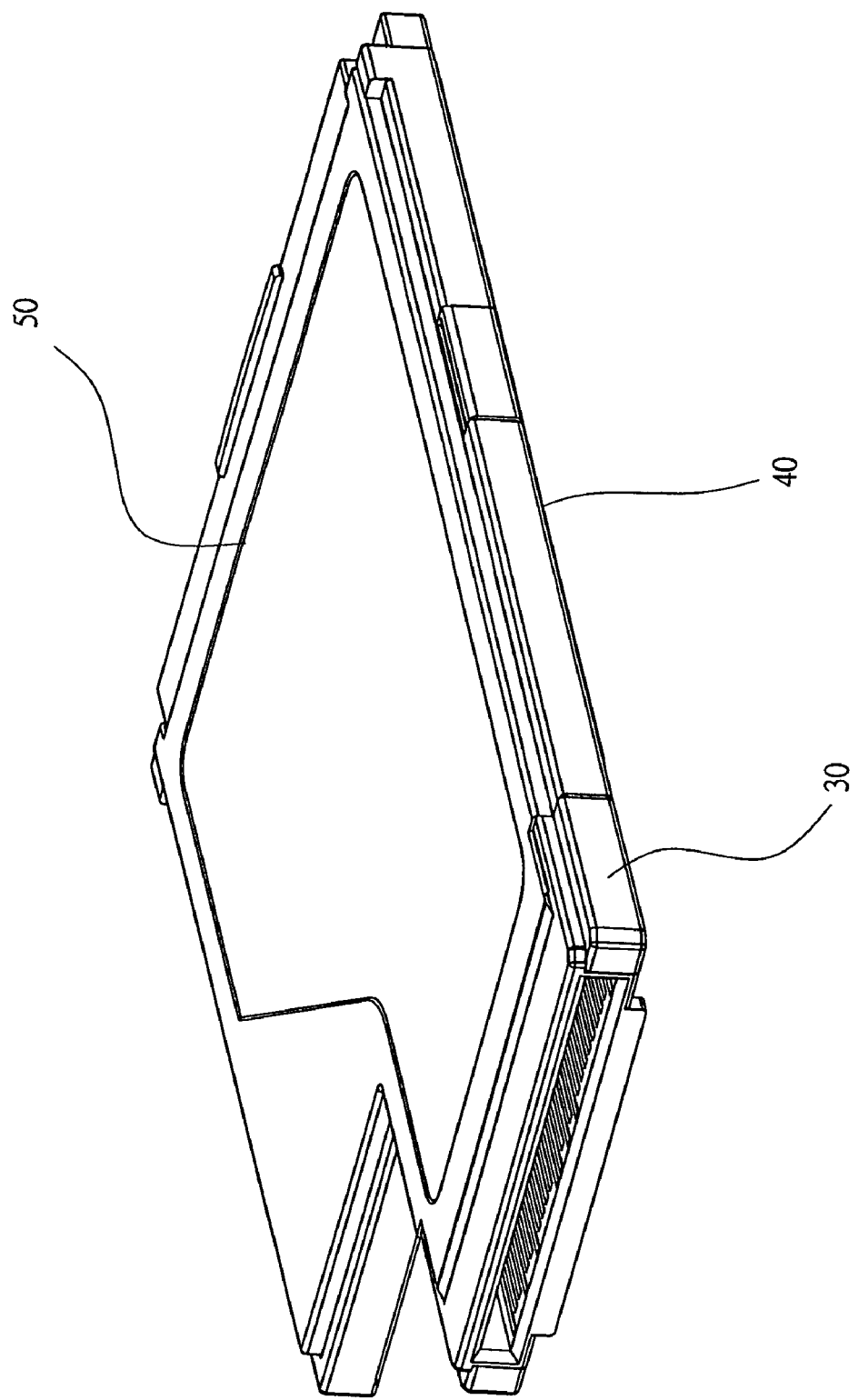
FIG. 6 shows an exploded elevational view illustrating another embodiment according to the invention.

Referring to FIG. 6 showing an exploded elevational view of another embodiment according to the invention, the upper housing 50, the lower housing 40 and the main frame 30 are devised in other shapes for coordinating with new-type express card specifications.

According to the aforesaid assembled structure, the following effects are achieved:
1. The inverted U-shaped clasp sections at the upper housing are correspondingly positioned in the clasp indentations at the two sides of the main frame, thereby quickly assembling the aforesaid structures in a handy manner.
2. Using the connect pin sections between the terminal bodies and the connecting portion, the terminals are snapped off after being inserted into the terminal groove at the rear end of the connector housing, such that the terminal bodies are remained in the connector housing for speeding up time required for installation.
3. The locating sections at two outer left and right sides of the connector housing can be inserted into the locating notches of the main frame, thereby accurately installing the connector housing in the main frame.
4. By corresponding the square locating members of the locating sections in the square locating indentations of the locating notches, disengagement is prevented when the invention is in assembly.
5. The clasp sections at the front end of the connector housing are clasped in the clasp channels to preventing a front section of the upper housing from lifting.

Conclusive from the above, the express card housing structure according to the invention accomplishes effects of simple installation and replacement procedures. It is of course to be understood that the embodiments described herein are merely illustrative of the principles of the invention and that a wide variety of modifications thereto may be effected by persons skilled in the art without departing from the spirit and scope of the invention as set forth in the following claims.

What is claimed is:

1. An express card housing structure comprising a connector housing, terminals, a main frame, a lower housing and an upper housing; and being characterized that:
   the connector housing has a perforated terminal groove at a center section thereof, an opening at a front end thereof, locating sections at left and right sides thereof, and clasp channels at two rear sides thereof;
   each of the terminal is consisted of a terminal body at a front end thereof and a rear connecting portion at a rear end thereof, with a rear end of the terminal body downwardly bent to form a terminal pin; a joint of the terminal body and a connecting portion is a connect pin section; and an upper surface of the connecting portion is provided with two inverted V-shaped notches;
   the main frame appears as a U-shape when viewed from above, and has a post at a front end of an opening thereof; each of left and right frames is disposed with a locating notch at a front end thereof, a plurality of symmetrical fastening sections at an inner edge thereof, a symmetrical clasp channel located at an outer wall thereof and extending from a front end to a rear end; and the main frame is further disposed with a long groove at an upper rear portion thereof; and the lower housing has a plurality of symmetrical fastening openings at two lateral sides and a rear edge thereof for corresponding with the fastening sections of the main frame;
   the upper housing has clasp sections at a front end thereof for clasping with the clasp channels at two sides of the connector housing, inverted U-shaped clasp sections bent downward at two lateral sides thereof, and a folded panel bent downward at a rear end thereof.

2. The express card housing structure in accordance with claim 1, wherein the main frame is formed by metal molding.

3. The express card housing structure in accordance with claim 1, wherein each locating section of the connector housing has a square locating member at a rear end thereof.

4. The express card housing structure in accordance with claim 1, wherein each locating notch of the main frame has a square locating indentation.

* * * * *